(12) United States Patent
Sen et al.

(10) Patent No.: US 10,686,442 B2
(45) Date of Patent: Jun. 16, 2020

(54) DYNAMIC ELEMENT MATCHING OF RESISTORS IN A SENSOR

(71) Applicant: STMicroelectronics International N.V., Amsterdam (NL)

(72) Inventors: Tanmoy Sen, Noida (IN); Aswani Aditya Kumar Tadinada, New Delhi (IN)

(73) Assignee: STMICROELECTRONICS INTERNATIONAL N.V., Amsterdam (NL)

( * ) Notice: Subject to any disclaimer, the term of this patent is extended or adjusted under 35 U.S.C. 154(b) by 266 days.

(21) Appl. No.: 15/783,897

(22) Filed: Oct. 13, 2017

(65) Prior Publication Data
US 2018/0054197 A1 Feb. 22, 2018

Related U.S. Application Data

(63) Continuation of application No. 14/015,028, filed on Aug. 30, 2013, now Pat. No. 9,819,344.

(51) Int. Cl.
*H03K 19/00* (2006.01)
*H03K 19/003* (2006.01)

(52) U.S. Cl.
CPC .... *H03K 19/00369* (2013.01); *Y10T 307/747* (2015.04)

(58) Field of Classification Search
CPC ...................................................... H03K 19/00
USPC ....................................................... 307/113
See application file for complete search history.

(56) References Cited

U.S. PATENT DOCUMENTS

| 6,392,636 | B1 | 5/2002 | Ferrari et al. |
| 6,496,133 | B1 | 12/2002 | Yilmaz |
| 8,096,707 | B2 | 1/2012 | Raychowdhury et al. |
| 8,207,724 | B2 | 6/2012 | Riehl |
| 2001/0028571 | A1* | 10/2001 | Hanada ............... H02J 7/342 363/50 |
| 2008/0224909 | A1* | 9/2008 | Itoh ................ H03M 1/0863 341/144 |
| 2011/0260708 | A1 | 10/2011 | Trifonov et al. |

OTHER PUBLICATIONS de Jong et al., "A 300° C. Dynamic-Feedback Instrumentation Amplifier," *IEEE Journal of Solid-State Circuits* 33(12): 1999-2009, Dec. 1998.

* cited by examiner

*Primary Examiner* — Rexford N Barnie
*Assistant Examiner* — Joseph N Inge
(74) *Attorney, Agent, or Firm* — Seed IP Law Group LLP (57) ABSTRACT

A method and apparatus for dynamically matching a plurality of resistors to a sensor are disclosed. In the method and apparatus, a switching block of a plurality of switching blocks receives a plurality of selection signals. The switching block is coupled to a resistor array having a plurality of resistors that are coupled in series and arranged in a closed loop. Each two resistors are coupled to each other by a respective resistor node of a plurality of resistor nodes. The switching block of the plurality of switching blocks has a plurality of input nodes and an output node, where the output node is coupled to the respective resistor node of the plurality of resistor nodes. In the method and apparatus, the switching block couples an input node of the plurality of input nodes to the output node based on the selection signals.

20 Claims, 5 Drawing Sheets

DYNAMIC ELEMENT MATCHING OF RESISTORS IN A SENSOR

BACKGROUND

Technical Field

The present disclosure is directed to a method and apparatus for reducing the error from resistor mismatch in a sensor and more particularly, to a switching resistor array capable of producing multiple equivalent resistive loads as seen by the detection elements of a sensor.

Description of the Related Art

In applications where a change in external conditions affects the operation of components in the application, sensors may be implemented which sense the external conditions of an application device. This may be of interest to applications embedded on an integrated circuit, for example. In these applications changes to the external conditions may affect the functioning of integrated circuit components. For example a higher temperature may lead to a degradation in the performance of the integrated circuit (IC), may accelerate the degradation of the IC and/or may reduce the lifetime of the IC. The temperature may be reduced or controlled by turning off one or more of the less important blocks of an IC, reducing operating current and/or performance mode, controlling the speed of a fan on the IC, and other such temperature control measures.

A sensor may monitor the external conditions of a circuit, for example an integrated circuit and in some cases condition management may be carried out. For example, if a circuit becomes too hot, cooling systems such as a fans or liquid cooling may be activated in order to reduce a chip temperature or may be deactivated to save power if the chip temperature is low enough.

Sensors may be provided as analog components which measure and produce an analog signal indicative of the change in conditions. The analog signal may be converted into a digital signal for processing by on-chip circuitry. As on-chip area may be limited, there is often a trade-off between sensor sensitivity or accuracy and size.

BRIEF SUMMARY

There is provided according to a first aspect an apparatus comprising: a sensor; a resistor array comprising a set of resistors; wherein on a first cycle: at least one first of said resistors is configured to provide a first resistance value; and on a second cycle: at least one second of said resistors is configured to provide said first resistance value.

On said first cycle: at least one third of said resistors may be configured to provide a second resistance value; and on said second cycle at least one fourth of said resistors may be configured to provide said second resistance value.

The array of resistors may be arranged in a loop.

At least one second of resistors and/or said at least one fourth of said resistors may comprise a respective one of said at least one first resistor.

The at least one second of resistors and/or said at least one fourth of said resistors may comprise a respective one of said at least one third resistor.

The resistor array is may be configured to provide at least one further resistance value.

A total resistance provided by said resistor array may be the sum of the required resistance values.

The sensor may comprise a plurality of transistors configured to provide a first and second output voltage.

The apparatus may further comprise: a comparator configured to provide a comparison signal indicative of a difference between said first output voltage and said second output voltage and to provide; and a current regulator configured to regulate a current provided to the resistor array independence on said comparison signal.

The apparatus may be further configured to output at least one of said first and second output voltage.

The apparatus may further comprise an analog to digital converter configured to convert said output voltage to a digital signal.

The apparatus may further comprise an average configured to average a plurality of digital signals received from said analog to digital converter.

The sensor may be at least one of a temperature sensor, a light sensor, a strain gauge, an acoustic sensor and a vibration sensor.

The sensor may use precision bandgap voltage references.

An integrated circuit may comprise the apparatus.

There is provided according to a second aspect a method comprising: providing a first resistance value to a sensor on a first cycle wherein said first resistance value is provided by at least one first resistor in a resistor array comprising a set of resistors; and providing said first resistance value to said sensor on a second cycle wherein said first resistance value in provided by at least one second resistor in said resistor array.

The method may comprise: providing a second resistance value by at least one third of said resistors on said first cycle; and providing said second resistance value by at least one fourth of said resistors on said second cycle.

The array of resistors may be arranged in a loop.

The at least one second of resistors and/or said at least one fourth of said resistors may comprise a respective one of said at least one first resistor.

The at least one second of resistors and/or said at least one fourth of said resistors may comprise a respective one of said at least one third resistor.

The method may further comprise providing at least one further resistance value from said resistor array.

A total resistance provided by said resistor array may be the sum of the required resistance values.

The sensor may comprise a plurality of transistors configured to provide a first and second output voltage.

The method may further comprise: providing a comparison signal indicative of a difference between said first output voltage and said second output voltage; and regulating a current provided to the resistor array independence on said comparison signal.

The method may further comprise: outputting at least one of said first and second output voltage.

The method may further comprise: converting said output voltage to a digital signal.

The method may further comprise: averaging a plurality of said digital signals.

The sensor may be at least one of a temperature sensor, a light sensor, a strain gauge, an acoustic sensor and a vibration sensor.

The sensor may use precision bandgap voltage references.

A computer program product may be configured to perform the method.

There is provided according to a third aspect an apparatus comprising: means for providing a first resistance value to a sensor on a first cycle wherein said first resistance value is provided by at least one first resistor in a resistor array comprising a set of resistors; and means for providing said first resistance value to said sensor on a second cycle wherein said first resistance value in provided by at least one second resistor in said resistor array.

The apparatus may comprise: means for providing a second resistance value by at least one third of said resistors on said first cycle; and means for providing said second resistance value by at least one fourth of said resistors on said second cycle.

The array of resistors may be arranged in a loop.

The at least one second of resistors and/or said at least one fourth of said resistors may comprise a respective one of said at least one first resistor.

The at least one second of resistors and/or said at least one fourth of said resistors may comprise a respective one of said at least one third resistor.

The apparatus may further comprise means for providing at least one further resistance value from said resistor array.

A total resistance provided by said resistor array may be the sum of the required resistance values.

The sensor may comprise a plurality of transistors configured to provide a first and second output voltage.

The apparatus may further comprise: means for providing a comparison signal indicative of a difference between said first output voltage and said second output voltage; and means for regulating a current provided to the resistor array independence on said comparison signal.

The apparatus may further comprise: means for outputting at least one of said first and second output voltage.

The apparatus may further comprise: mean for converting said output voltage to a digital signal.

The apparatus may further comprise: means for averaging a plurality of said digital signals.

The sensor may be at least one of a temperature sensor, a light sensor, a strain gauge, an acoustic sensor and a vibration sensor.

The sensor may use precision bandgap voltage references.

An integrated circuit may comprise the apparatus.

BRIEF DESCRIPTION OF THE SEVERAL VIEWS OF THE DRAWINGS

Embodiments of the present application will now be described with reference to the following figures in which.

DETAILED DESCRIPTION

In the following description, certain specific details are set forth in order to provide a thorough understanding of various embodiments of the disclosure. However, one skilled in the art will understand that the disclosure may be practiced without these specific details. In other instances, well-known structures associated with sensors and resistor arrays have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

In addition, reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the drawings, identical reference numbers identify similar features or elements. The size and relative positions of features in the drawings are not necessarily drawn to scale. For example, the shapes of various features are not drawn to scale, and some of these features are enlarged and positioned to improve drawing legibility.

Sensors may implement analog circuitry for sensing a change in the sensed conditions and then convert an analog signal corresponding to the sensed change to a digital signal for processing by on-chip digital circuitry. The digital indication of the temperature may be considered to be output code or an output signal—namely digital values corresponding to the analog sensed change.

Figure 1:
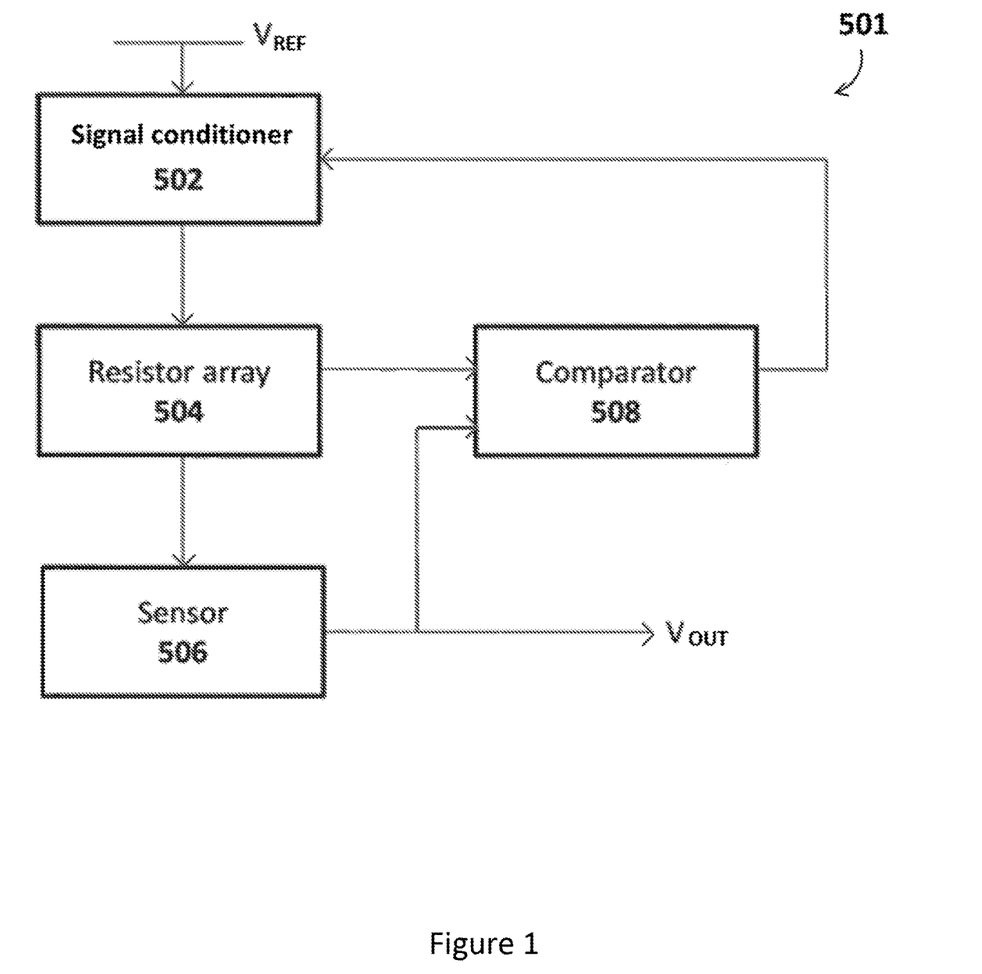
FIG. 1 is a block diagram of a temperature sensor formed in accordance with one aspect of the present disclosure.

FIG. 1 is a block diagram of an arrangement 501 for sensing change according to some embodiments of the present disclosure. Switching circuitry 502 may be configured to receive as in an input a fixed voltage $V_{ref}$ and to selectively output a fixed voltage which may be received as an input by a resistor array 504. The resistor array 504 may be configured to provide as an output a first signal which is received as an input by a comparator 508. The resistor array 504 may be further configured to provide as an output at least one further signal which is received as an input by the sensor 506. The sensor 506 may be configured to provide as an output a signal Vout which may be the output of the sensing arrangement 501. The output signal may also be received as an input by the comparator 508. The selective output of the switching circuitry 502 may be controlled by a signal which is provided as an output by the comparator 508 and received as an input by the switching circuitry 502.

The operation of the sensing arrangement is described in more detail in relation to the embodiments below. In particular, the sensing arrangement includes a resistor mismatch compensation circuit, such as matching block 103 in FIG. 2. The signal conditioner 502 regulates a power source $V_{REF}$ provided to the resistor array 504, where the resistor array provides a modular resistive load to the sensor 506. The sensor 506 produces an output $V_{OUT}$ that a comparator 508 compares to a signal from the resistor array 504 to control the signal conditioner 502

The sensor 506 may be one or more of a temperature sensor, a light sensor, a strain gauge, an acoustic sensor, or a vibration sensor. The sensor may use precision bandgap voltage references.

A temperature sensor may be implemented using a bandgap reference circuit in which a base-emitter voltage of a transistor is indicative of the temperature experienced by the circuit. The implementation of the bandgap reference circuit may use a number of resistors to bias the measuring transistors, i.e., the resistor array.

Accuracy of the temperature sensor is greatly affected by resistor mismatch. Resistor mismatch may be decreased and consequently accuracy of the temperature sensor may be increased by increasing the area of the resistors. The necessary increase in resistor area may lead to a very large sized temperature sensor. For example, in a 28 nm design of a +/−1° C. accuracy temperature sensor, resistance area (bandgap resistances) may be 0.13 mm².

An area available for the temperature sensor may be limited and for a limited size temperature sensor, the contribution to the output signal uncertainty (temperature sensor inaccuracy) by the resistor mismatch may become significant. Embodiments of the present disclosure may provide a method and apparatus to address the resistor mismatch while taking into account the limitation in area available for a temperature sensor. A reduction in resistance mismatch to lower levels may allow for lower area requirements and lower output signal uncertainty levels in a temperature sensor. Some embodiments may compensate for this resistor mismatch.

In some embodiments, a temperature sensor may include bandgap reference architecture for the sensing. This architecture may be modified to allow efficient dynamic element matching of resistors. Some embodiments may provide an output signal averaging function to take the resistor element matching into account. In some embodiments, the output signal error that remains may just be due to second-order remnant mismatch of the resistors. This second-order remnant mismatch of resistors may have a smaller effect on accuracy.

Figure 2:
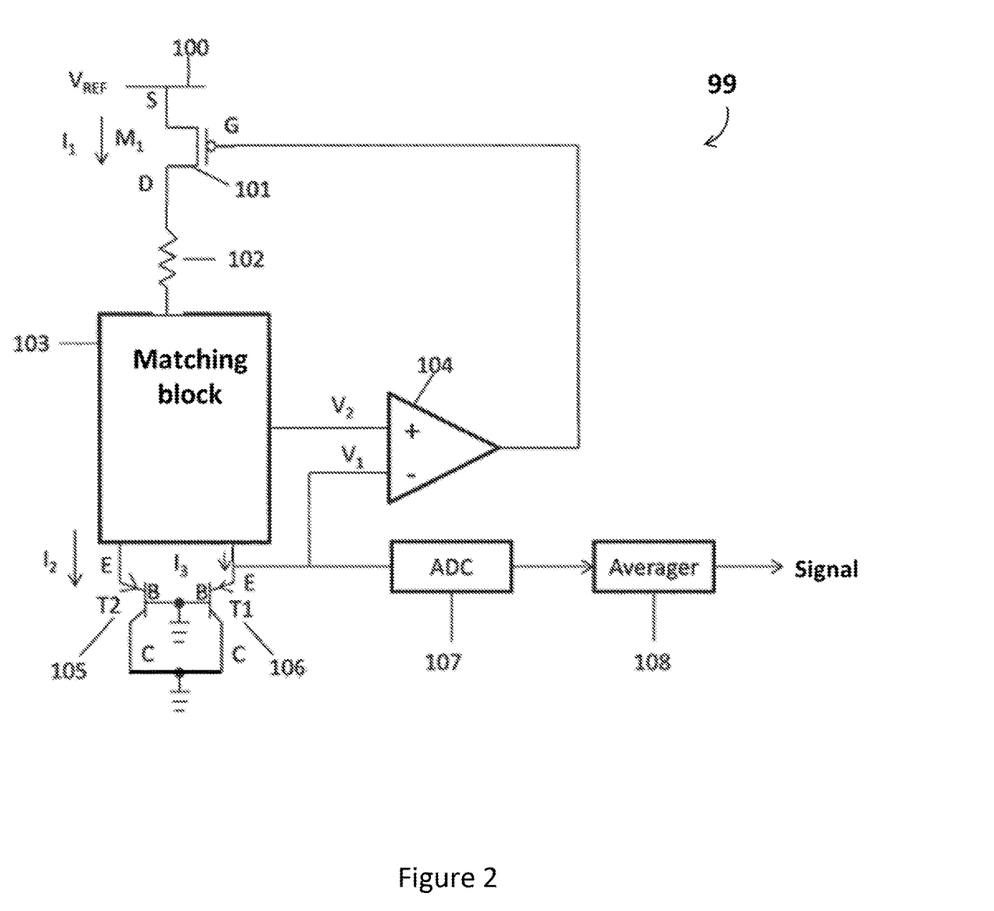
FIG. 2 is a block diagram of a resistor array coupled to a temperature sensor.

FIG. 2 shows an example of a temperature sensor 99 according to one embodiment of the present disclosure. FIG. 2 comprises a voltage source $V_{REF}$ 100, a first p-channel MOSFET M1 101, a correction resistor 102, a dynamic element matching block 103, an operational amplifier 104, a first bipolar junction transistor T1 106, a second bipolar junction transistor T2 105, an analog to digital converter 107 and an averager 108.

A source terminal of a field effect transistor M1 101 is coupled to the voltage source $V_{REF}$ 100 and a drain terminal of transistor M1 101 is coupled to a first terminal of the resistor 102. A second terminal of the resistor 102 is coupled to the dynamic element matching block 103. A gate terminal of transistor M1 101 is coupled to the output of the operational amplifier 104.

The matching block 103 of FIG. 2 corresponds generally to the resistor array 504 of FIG. 1 and the transistor 105 and 106 correspond to the sensor 506 of FIG. 1. In this example of using transistors 105 and 106, the sensor is a temperature sensor. Of course other components in place of transistors 105 and 106 can be coupled to the matching block 103 to sense different conditions such as light, sound, stress, strain, vibration and others. The transistors 105 and 106 are therefore one type of sensor to which the matching block 103 can be coupled.

An emitter terminal of transistor T2 105 is coupled to the dynamic element matching block 103 and a collector terminal of transistor T2 105 is coupled to a collector terminal of transistor T1 106. A base terminal of transistor T2 105 is coupled to a base terminal of transistor T1 106 and further coupled to ground. An emitter terminal of T1 106 is coupled to the dynamic element matching block 103 as well as to the analog to digital converter 107.

A non-inverting input of the operational amplifier 104 is coupled to the dynamic element matching block 103 and configured to receive as an input signal $V_2$ and an inverting input of the operational amplifier 104 is coupled to the emitter terminal of transistor T1 106 and configured to receive as an input signal $V_1$.

The analog to digital converter 107 provides an output, for example digital samples, to an optional averager 108. The averager 108 may provide the output signal corresponding to an average temperature sensed by the temperature sensor over the range of different configurations of the resistor array 103. Further, an analog to digital converter 107 may be coupled between the signal $V_1$ and the averager 108, in which the averager 108 outputs a digital signal that reflects the average output over a range of different configurations of the matching block 103.

In one embodiment, voltages across the emitter-bases of transistors T2 105 and T1 106 are temperature dependent. A current $I_2$ set by transistor M1 101 and the dynamic element matching circuit 103 may be provided through transistor T2 105. A current $I_3$ set by the current through the transistor M1 101 and by the dynamic element matching 103 may be provided through the first transistor T1 106.

Figure 3:
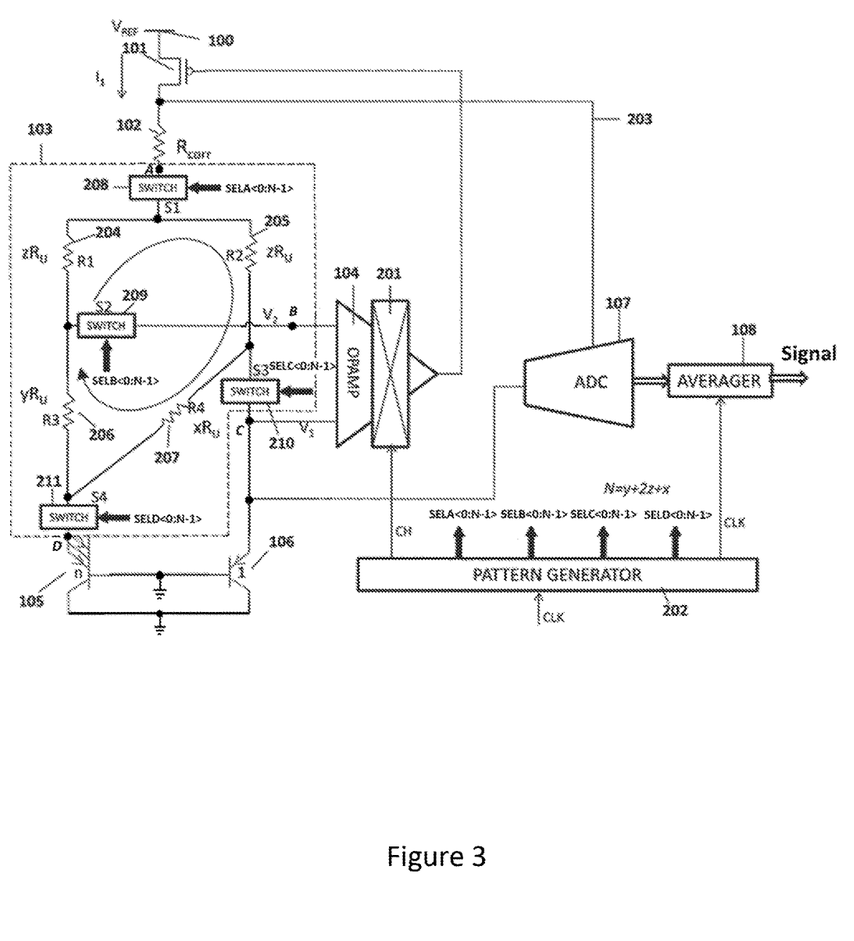
FIG. 3 is a more detailed view of the elements of FIG. 2.

FIG. 3 is a more detailed view of the circuit of FIG. 2 according to an embodiment of the present disclosure. In particular, the matching block 103 is formed as a resistor array that includes a plurality of resistors and switching blocks. The dynamic element matching block 103 comprises a first switch S1 208, with a first terminal coupled to the correction resistor 102 and a second terminal coupled to a first terminal of a first resistor R1 204 and a first terminal of a second resistor R2 205.

A second terminal of resistor R1 204 is coupled to a first terminal of a second switch S2 209, as well as a first terminal of a third resistor R3 206. A second terminal of the switch S2 209 may be coupled to a first input of the operational amplifier 104. A second terminal of resistor R2 205 may be coupled to a first terminal of a third switch S3 210, and a first terminal of a fourth resistor R4 207. A second terminal of the switch S3 210 may be coupled to a second input of the operational amplifier as well as to the emitter terminal of the first transistor T1 106.

A second terminal of resistor R3 206 may be coupled to a first terminal of a fourth switch S4 211. The first terminal of switch S4 211 may be further coupled to a second terminal of resistor R4 207. A second terminal of the switch S4 211 may be coupled to an emitter terminal of the second transistor T2 105.

Reference point A is provided between resistor $R_{corr}$ 102 and switch Si 208. Reference point B is provided between switch S2 209 and the operational amplifier 104. Reference point C is provided between the transistor T1 106 and the operational amplifier 104 and Reference point D is provided between switch S4 211 and the transistor T2 105.

Each of the switches S1, S2, S3, and S4 may be a single switch or an array of switches. In one embodiment, each switch S1, S2, S3, and S4 is a switch block that is configured to receive a plurality of selection signals and to couple a node of a resistor to the node, A, B, C, or D, in the resistor array, see FIG. 4.

The operational amplifier 104 may compare an input measured at the node between a resistor R1 204 and a resistor R3 206 to an input measured at the node between a resistor R2 205 and a resistor R4 207. It will be appreciated that the voltage across the emitter-base of these transistors may be affected by the temperature at which the circuit is operating.

The operational amplifier 104 may determine the difference between the emitter base voltage of transistor T2 and the emitter base voltage $V_{EB}$ of transistor T1 under these conditions. The operational amplifier 104 outputs a signal indicative of the difference in the $V_{EB}$ of transistors T2 105 and T1 106. The operational amplifier 104 output is provided as a control signal to the gate of the transistor M1 101 which may control a current $I_1$ passed through M1 101 to keep the current $I_1$ constant.

In some embodiments, the signal $V_1$ which is output to the inverting input of the operational amplifier 104 is determined by:

$$V_1 = V_{REF} - V_{EB1} \tag{1}$$

wherein:

$V_{REF}$ is the voltage received by the source of transistor M1; and $V_{EB1}$ is the emitter-base voltage of transistor T1.

The signal $V_2$ which is output to the non-inverting input of the operational amplifier 104 is determined by:

$$V_2 = V_{REF} - V_{EB2} \tag{2}$$

wherein:

$V_{EB2}$ is the emitter-base voltage of transistor T2.

The characteristics of transistor T1 and T2 mean that the emitter-base voltages $V_{EB1}$ and $V_{EB2}$ are temperature dependent. As $V_1$ is output to the ADC 107, the sensor is configured to provide as an output a temperature dependent signal. As the operational amplifier receives the two temperature dependent signals, it controls the transistor M1 in dependence of these two signals such that the current $I_1$ supplied to the resistor array 103 is constant.

The operational amplifier is configured to control the transistor M1 such that a constant current which is independent of temperature is passed to the temperature sensor. The operational amplifier achieves this by comparing a voltage corresponding to the $V_{EB}$ of transistor T2 to the $V_{EB}$ of the transistor T1. Transistor T1 and transistor T2 have different emitter current densities which results in different temperature dependence voltage characteristics. The operational amplifier 104 controls the transistor M1 based on the difference in VEB of the two transistors so that the temperature performance is not affected by resulting changes in current flow. The indication of temperature from transistor T1 106 is provided to an analog to digital converter 107 which in turn provides samples to an averager 108. The averager averages the samples and provides an output signal which corresponds to digital values indicating a temperature experienced by the circuit. In some embodiments the averager may receive at least two digital temperature samples in a fixed period and provide as an output an average of the values of the samples received.

The resistances provided in the dynamic element matching block 103 may be provided to split the regulated current $I_1$ into constant currents $I_2$ and $I_3$. Mismatches in the resistance provided to split the current may lead to a decrease in the accuracy of the temperature measured or use a large area for implementation.

Embodiments of the present application may address this by providing a resistance matching block as a dynamic element. In some embodiments this block may comprise a plurality of single unit resistors and switching circuitry which may combine the single unit resistors to provide the resistance in block 103. The resistance may be selected by combining different single unit resistors periodically to provide a same equivalent resistance in the block 103. The analog to digital converter may then sample the outputs corresponding to each combination of single unit resistors and may average the samples to reduce the effects of resistor mismatch.

FIG. 3 also depicts a pattern generator 202 configured to generate control signals SELA, SELB, SELC, SELD which are received by switches S1, S2, S3, and S4. The pattern generator 202 may further provide a clock signal to the averager 108 and a chopper signal CH to chopping circuitry 201 provided in the operational amplifier 104. It will be appreciated that the operational amplifier 104 may be chopped in order to modulate an input referred offset and noise at high frequencies.

In one embodiment, each of the resistors have the same unit value $R_u$. The number of resistors within the ring is calculated by summing the total number of unit resistors $R_u$ used to provide each of the resistances between A and B, A and C, and A and D as shown in FIG. 3. The total number of resistors in the loop may be:

$$N = 2z + y + x \tag{3}$$

where:

N is the total number of unit resistors $R_u$ in the loop or ring; z is the number of unit resistors $R_u$ directly coupling the switch S1 208 to the switch S2 209, which is represented by the first resistor R1 204, z is also the number of unit resistors $R_u$ directly coupling the switch S1 208 to the switch S3 210, which is represented by the second resistor R2 205;

y is the number of unit resistors $R_u$ directly coupling the switch S2 209 to the switch S4 211, which is represented by the third resistor R3 206; and x is the number of unit resistors $R_u$ directly coupling the switch S3 210 to the switch S3 211, which is represented by the fourth resistor R4 207.

In this embodiment, both of the representative resistances for the first resistor and the second resistor include the same number of unit resistors. In addition, x is a greater number than y. This arrangement allows the circuit to function and reach a stable operating condition. This difference in the number of resistors in each region of the loop, i.e., the group of first resistors, the group of second resistors, the group of third resistors, and the group of fourth resistors, is relevant to the differences in size of the bipolar transistors 105 and 106. In particular, the bipolar transistor 105 is larger than the bipolar transistor 106. Due to the imperfections of the semiconductor manufacturing process, each of the unit resistors will have a same value plus or minus a tolerance. Each of the unit resistors will have different behavior with respect to applied voltage and temperature. In this device, a ratio of the group of first resistors, the group of second resistors, the group of third resistors, and the group of fourth resistors provides an overall more consistent resistance to the bipolar transistors 105, 106 when operated in accordance with the process described below.

Figure 4:
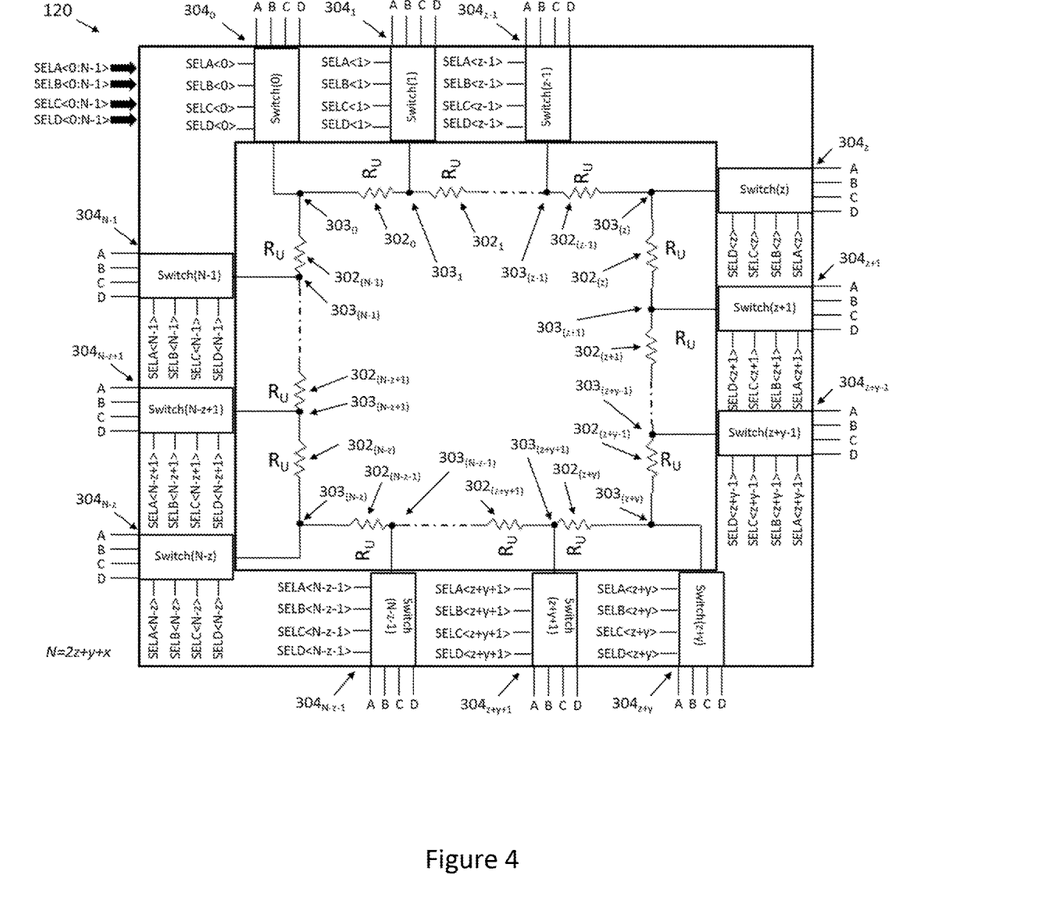
FIG. 4 is one embodiment of a resistor array according to the present disclosure.

FIG. 4 is an embodiment of a resistor array 120 included as part of the dynamic element matching block 103 in accordance with an embodiment of the present disclosure. A set of resistors $302_{(0:N-1)}$ are arranged in a ring or loop. Switches $304_{(0:N-1)}$ are coupled to respective nodes $303_{(0:N-1)}$, which are positioned between the resistors $302_{(0:N-1)}$. Each of the respective switches are configured to couple the node to one of points A, B, C and D shown in FIG. 3 or to leave the node uncoupled.

Each of the switches $304_{(0:N-1)}$ may be a block or group of switches, which are configured to receive the selection signals SELA, SELB, SELC, SELD. In addition, each of the switches $304_{(0:N-1)}$ is configured to be coupled to one of the nodes A, B, C, D (see FIG. 3), or remain uncoupled based on the selection signals SELA, SELB, SELC, SELD. Each of the nodes $303_{(0:N-1)}$, is positioned between two of the unit resistors $302_{(0:N-1)}$. For example, node $303_0$ is positioned between resistor $302_{(N-1)}$ and resistor $302_0$. The switch $304_0$ is coupled to the node $303_0$ and is configured to couple the node $303_0$ to one of A, B, C, D, or remain uncoupled based on the selection signals $SELA_0$, $SELB_0$, $SELC_0$ and $SELD_0$. The selection signals are generated by the pattern generator 202, see FIG. 3.

Each of the resistors has the same unit value $R_u$. As described above, the number of resistors within the ring is calculated by summing the total number of unit resistances $R_u$ utilized to provide the appropriate resistance to the bipolar transistors. The resistance of the groups of the resistors are between the nodes A and B, A and C, and A and D as shown in FIG. 3. Thus in this embodiment the total number of resistors in the loop is:

$$N = x + y + 2z. \quad (4)$$

The switches $304_{(0:N-1)}$ are connected as part of the resistor array 120 and are configured to receive a switching pattern from the pattern generator 202. For each cycle of a switching pattern, each switch will receive an indication of whether it should connect to point A, B, C, D or no point. For example, in one embodiment, on the first cycle:

the switch $304_0$ is electrically coupled to point A;

the switches $304_{(1)}$ to $304_{(z-1)}$ are uncoupled, which allows the resistors $302_0$ through $302_{(z-1)}$ to be coupled in series, the resistors $302_1$ and $302_{(z-1)}$ are shown separated by a dashed line which represents a number (z−3) of resistors that are between the resistors $302_1$ and $302_{z-1}$, where a total number of this first group of resistors is z;

the switch $304_z$ is electrically coupled to point B;

the switches $304_{(z+1)}$ to $304_{(z+y-1)}$ are uncoupled, which allows the resistors $302_z$ through $302_{(z+y-1)}$ to be coupled in series, the resistors $302_{z+1}$ and $302_{(z+y-1)}$ are shown separated by a dashed line which represents a number (y−3) of resistors that are between the resistors $302_{z+1}$ and $302_{z+y-1}$, where a total number of this first group of resistors is y;

the switch $304_{(z+y)}$ is electrically coupled to point D;

the switches $304_{(z+y+1)}$ through $304_{z+y+x-1}$, which is also $304_{N-z-1}$ are uncoupled, which allows the resistors $302_{z+y}$ through $302_{(z+y+x-1)}$, which is also $302_{N-z-1}$ to be coupled in series, the resistors $302_{(z+y+1)}$ and $302_{(N-z-1)}$ are shown separated by a dashed line which represents a number (x−3) of resistors that are between the resistors $302_{z+y+1}$ and $302_{N-z-1}$, where a total number of this first group of resistors is x;

the switch $304_{(N-z)}$ is electrically coupled to point C; and the switches $304_{(N-z+1)}$ through $304_{N-1}$ are uncoupled, which allows the resistors $302_{N-z}$ through $302_{(N-1)}$ to be coupled in series, the resistors $302_{N-z+1}$ and $302_{(N-1)}$ are shown separated by a dashed line which represents a number (z−3) of resistors that are between the resistors $302_{N-z}$ and $302_{N-1}$, where a total number of this first group of resistors is z.

On the next cycle, the pattern rotates one place clockwise such that:

point A is electrically coupled to switch $304_1$;
point B is electrically coupled to switch $304_{(z+1)}$;
point D is electrically coupled to switch $304_{(z+y+1)}$;
point C is electrically coupled to switch $304_{(z+y+x+1)}$, which is also $302_{(N-z+1)}$; and the remaining switches are uncoupled.

For each cycle of the pattern, the connected switches step around the loop N times such that each node between the resistors of the resistor array 120 is connected to each of point A, B, C and D once in the pattern.

The pattern may be repeated 1 or more times. In some embodiments the pattern may rotate counterclockwise rather than clockwise. The pattern may be randomized or determined such that the switches connect to the points in any set pattern provided each switch connects to each point once within the pattern and the pattern is N steps long.

In one embodiment, because each step covers a uniform number of discrete resistors and the resistors values are uniform, the resistance as seen by an emitter of transistor T1 206 and an emitter of transistor T2 205 can be modeled by the below equations:

$$R_{T1} = R_{corr} + \frac{(zR_u)(zR_u + yR_u + xR_u)}{(zR_u) + (zR_u + yR_u + xR_u)}$$

$$R_{T2} = R_{corr} + \frac{(zR_u + yR_u)(zR_u + xR_u)}{(zR_u + yR_u) + (zR_u + xR_u)}$$

In a complete cycle each discrete unit resistor will transition through a number of positions equal to the number of resistors N. The unit resistors $R_u$ have inherent variation due to manufacturing defects, temperature variations, etc. When the output is averaged over the entire cycle, the propagation of each unit resistor through the resistor array effectively averages out the resistance variation of each unit resistor $R_u$.

Figure 5:
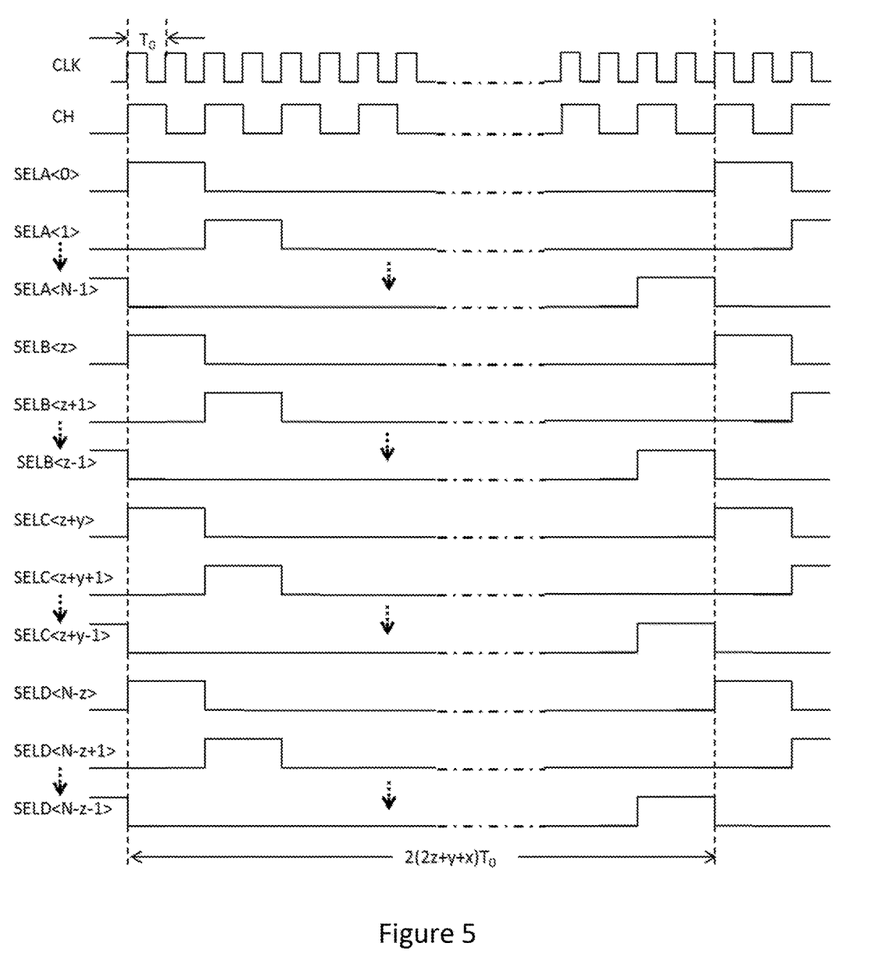
FIG. 5 is a timing diagram associated with the resistor array of FIG. 4.

FIG. 5 shows one embodiment of a timing diagram for the signals SELA<0:N−1>, SELB<0:N−1>, SELC<0:N−1>, and SELD<0:N−1> generated by the pattern generator 202. The signal SELA<0> controls the switch coupled to node A in switch block $304_0$. The signals SELB<0>, SELC<0>, and SELD<0> connect similarly to the switches of switch block $304_0$ coupled to node B, C and D, respectively. For example, when the select signal is high the switch closes and when the select signal is low the switch opens.

A single cycle through all of the nodes includes a plurality of steps. At time equals zero, the signals SELA<0>, SELB<z>, SELC<z+y>, and SELD<N−z> are high, and all other select signals are low. At the next step of the cycle, the previously active switches close and SELA<1>, SELB<z+1>, SELC<z+y+1>, and SELD<N−z+1> go high. This stepping of the circuit moves the node connections clockwise around the circuit shown in FIG. 4. Because the resistors array is connected in a ring, after a node is connected to the switch block $304_{N-1}$, the next step takes the select signal back to switch block $304_0$. The last step of one complete cycle has SELA<N−1>, SELB<z−1>, SELC<z+y−1>, and SELD<N−z−1> are high, and all other select signals are low.

In some embodiments, the pattern generator is configured such that the chopper clock CH provided to the operational amplifier 104 has half the frequency of the clock provided to the averager. The frequency of the chopper clock is determined in order to compensate for an offset within the operational amplifier. Each cycle within the switching pattern may last for at least the length of the chopper clock and so the length of each pattern may last for:

$$\text{Pattern cycle} = 2NT_0 \quad (2)$$

where:
$T_0$ is the clock period; and
N is the total number of resistors in the loop.

In some embodiments the change in the base-emitter voltage of the transistors 105, 106 may be used to sense an environment change other than temperature.

In some embodiments the sensor may comprise: NPN and/or PNP/transistors.

In some embodiments the transistors may be at least one of bipolar junction transistors; field effect transistors; resistors, diodes, photo diodes, or photovoltaic transistors.

In some embodiments the resistors may be arranged in a loop, ring or mesh.

In some embodiments the unit resistance of the resistors may depend on the values of x, y and z.

In some embodiments the resistor array may comprise other circuit components.

In some embodiments the resistor array may be configured to provide at least one impedance as well as, or as an alternative to at least one resistance.

In some embodiments the application device provided with the sensor may be a circuit, a handheld device, or a computer.

Some embodiments may provide a sensor system comprising a resistor array formed from a plurality of resistors wherein the resistor array is configured to provide at least one resistance from at least one different resistor at each clock signal. In other words, the resistance may be provided by a first set of resistors on a first cycle, a second set of resistors on a second cycle, a third set of resistors on a third cycle and so on.

In some embodiments at least one resistor in the first set may also be in a subsequent set.

In some embodiments the analog to digital converter (ADC) may be a direct conversion ADC; a flash ADC, a success approximation ADC, a ramp-compare ADC or a delta-sigma ADC.

It should be appreciated that embodiments may be implemented by one or more computer programs running one or more processors, hardware, firmware, dedicated circuits or any combination of two or more of the above. Some embodiments may make use of one or more memories. For example computer programs may comprise computer executable instructions which may be stored in one or more memories. When run, the computer program(s) may use data which is stored in one or more memories.

Various modifications to the embodiments described above will readily occur to a person skilled in the art. The present disclosure is not limited to these specific examples.

The various embodiments described above can be combined to provide further embodiments. All of the U.S. patents, U.S. patent application publications, U.S. patent application, foreign patents, foreign patent application and non-patent publications referred to in this specification and/or listed in the Application Data Sheet are incorporated herein by reference, in their entirety. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A resistor system, comprising:
a resistor array including a plurality of resistors that are coupled in series and arranged in a closed loop, the plurality of resistors being grouped in a plurality of groups, each two resistors of the plurality of resistors are coupled to each other by a respective resistor node of a plurality of resistor nodes;
a pattern generator configured to: generate a plurality of selection signals and output the plurality of selection signals to couple a first configuration of the plurality of groups to a sensor during a first part of a cycle and to couple a second configuration of the plurality of groups to the sensor during a second part of the cycle, the pattern generator being configured to generate the plurality of selection signals to rotate the second configuration around the closed loop in relation to the first configuration; and
a switching device including a plurality of switching blocks corresponding to the plurality of resistor nodes, respectively, a switching block of the plurality of switching blocks including a plurality of input nodes and an output node, the output node being coupled to the respective resistor node of the plurality of resistor nodes, the switching block being configured to receive the plurality of selection signals, and based on the plurality of selection signals, the switching block is configured to couple an input node of the plurality of input nodes to the output node.

2. The resistor system of claim 1, wherein a first group of the plurality of groups has a same number of resistors as a second group of the plurality of groups and a number of resistors in a third group of the plurality of groups is less than
a number of resistors in a fourth group of the plurality of groups.

3. The resistor system of claim 1, wherein the sensor has a terminal coupled to the switching device.

4. The resistor system of claim 1, wherein the pattern generator is configured to rotate the second configuration one clockwise step around the closed loop in relation to the first configuration.

5. The resistor system of claim 1, wherein the plurality of resistors in the resistor array have approximately the same resistance.

6. The resistor system of claim 1, wherein the switching block is configured to couple the input node of the plurality of input nodes to the output node or leave the input node of the plurality of input nodes uncoupled based on the plurality of selection signals.

7. A system, comprising:
a resistor array having a plurality of resistors coupled in series and arranged in a closed loop, each two resistors of the plurality of resistors are coupled to each other by a respective resistor node of a plurality of resistor nodes;
a pattern generator configured to generate a plurality of selection signals;
a switching device having a plurality of switching blocks corresponding to the plurality of resistor nodes, respectively, a switching block of the plurality of switching blocks having a plurality of input nodes and an output node, the output node being coupled to the respective resistor node of the plurality of resistor nodes, the switching block being configured to receive the plurality of selection signals, and based on the plurality of selection signals, the switching block is configured to couple an input node of the plurality of input nodes to the output node;
a sensor having first and second terminals respectively coupled to first and second switching blocks of the plurality of switching blocks;
a switch having a first conductive terminal coupled to a power supply node, a second conductive terminal coupled to a third switching block of the plurality of switching blocks and a control terminal; and
a comparator having a first input coupled to the first switching block of the plurality of switching blocks, a second input coupled to a fourth switching block of the plurality of switching blocks, and an output coupled to the control terminal of the switch.

8. The system of claim 7, wherein the resistor array includes:
a first group of resistors;
a second group of resistors;
a third group of resistors; and
a fourth group of resistors, a number of resistors in the fourth group being greater than a number of resistors in the third group, the first group having a same number of resistors as the second group.

9. The system of claim 7, comprising:
an analog-to-digital converter having an input coupled to the first switching block of the plurality of switching blocks and an output configured to output a signal representative of a measurement made by the sensor.

10. The system of claim 7, wherein the plurality of resistors in the resistor array have approximately the same resistance.

11. The system of claim 7, wherein the switching block is configured to couple the input node of the plurality of input nodes to the output node or leave the input node of the plurality of input nodes uncoupled based on the plurality of selection signals.

12. The system of claim 8, wherein the pattern generator is configured to generate the plurality of selection signals to couple a first configuration of the first, second, third, and fourth groups of resistors to the sensor during a first part of a cycle and to couple a second configuration of the first, second, third, and fourth groups of resistors to the sensor during a second part of the cycle.

13. The system of claim 12, wherein the pattern generator is configured to generate the plurality of selection signals to rotate the second configuration around the closed loop one clockwise step in relation to the first configuration.

14. A method, comprising:
generating a plurality of selection signals;
receiving, by a switching block of a plurality of switching blocks, the plurality of selection signals, the switching block being coupled to a resistor array having a plurality of resistors, the plurality of resistors being coupled in series and arranged in a closed loop, the plurality of resistors being grouped in a plurality of groups, each two resistors of the plurality of resistors are coupled to each other by a respective resistor node of a plurality of resistor nodes, the switching block of the plurality of switching blocks having a plurality of input nodes and an output node, the output node being coupled to the respective resistor node of the plurality of resistor nodes, the plurality of selection signals are generated to couple a first configuration of the plurality of groups to a sensor during a first art of a cycle and to couple a second configuration of the plurality of groups to the sensor during a second part of the cycle and to rotate the second configuration around the closed loop in relation to the first configuration; and
coupling, by the switching block of the plurality of switching blocks, an input node of the plurality of input nodes to the output node based on the plurality of selection signals.

15. The method of claim 14, wherein a first group of the plurality of groups has a same number of resistors as a second group of the plurality of groups and a number of resistors in a third group of the plurality of groups is less than a number of resistors in a fourth group of the plurality of groups.

16. A system, comprising:
a resistor array including a plurality of resistors that are coupled in series and arranged in a closed loop, the plurality of resistors being grouped in a plurality of groups, each two resistors of the plurality of resistors are coupled to each other by a respective resistor node of a plurality of resistor nodes;
a pattern generator configured to generate a plurality of selection signals to couple a first configuration of the plurality of groups to a sensor during a first part of a cycle and to couple a second configuration of the plurality of groups to the sensor during a second part of the cycle and to rotate the second configuration around the closed loop one clockwise step in relation to the first configuration; and
a switching device including a plurality of switching blocks corresponding to the plurality of resistor nodes, respectively, a switching block of the plurality of switching blocks including a plurality of input nodes and an output node, the output node being coupled to the respective resistor node of the plurality of resistor nodes, the switching block being configured to receive the plurality of selection signals, and based on the plurality of selection signals, the switching block is configured to couple an input node of the plurality of input nodes to the output node.

17. The system of claim 16, wherein the sensor has first and second terminals respective coupled to first and second switching blocks of the plurality of switching blocks.

18. The system of claim 17, comprising:
a switch having a first conductive terminal coupled to a power supply node, a second conductive terminal coupled to a third switching block of the plurality of switching blocks and a control terminal; and
a comparator having a first input coupled to the first switching block of the plurality of switching blocks, a second input coupled to a fourth switching block of the plurality of switching blocks, and an output coupled to the control terminal of the switch.

19. The system of claim 17, comprising:
an analog-to-digital converter having an input coupled to the first switching block of the plurality of switching blocks and an output configured to output a signal representative of a measurement made by the sensor.

20. The system of claim 16, wherein a first group of the plurality of groups has a same number of resistors as a second group of the plurality of groups and a number of resistors in a third group of the plurality of groups is less than a number of resistors in a fourth group of the plurality of groups.

* * * * *

UNITED STATES PATENT AND TRADEMARK OFFICE
CERTIFICATE OF CORRECTION

PATENT NO.        : 10,686,442 B2
APPLICATION NO.   : 15/783897
DATED             : June 16, 2020
INVENTOR(S)       : Tanmoy Sen Page 1 of 1

It is certified that error appears in the above-identified patent and that said Letters Patent is hereby corrected as shown below:

In the Claims

<u>Column 13, Line 50, Claim 14:</u>
"art" should read, --part--.

Signed and Sealed this
Eighteenth Day of August, 2020

Andrei Iancu
*Director of the United States Patent and Trademark Office*